US011139393B2

(12) United States Patent
Kato et al.

(10) Patent No.: US 11,139,393 B2
(45) Date of Patent: Oct. 5, 2021

(54) SEMICONDUCTOR DEVICE INCLUDING DIFFERENT NITRIDE REGIONS AND METHOD FOR MANUFACTURING SAME

(71) Applicants: KABUSHIKI KAISHA TOSHIBA, Minato-ku (JP); TOSHIBA ELECTRONIC DEVICES & STORAGE CORPORATION, Minato-ku (JP)

(72) Inventors: Daimotsu Kato, Kawasaki (JP); Yosuke Kajiwara, Yokohama (JP); Akira Mukai, Kawasaki (JP); Aya Shindome, Yokohama (JP); Hiroshi Ono, Setagaya (JP); Masahiko Kuraguchi, Yokohama (JP)

(73) Assignees: KABUSHIKI KAISHA TOSHIBA, Minato-ku (JP); TOSHIBA ELECTRONIC DEVICES & STORAGE CORPORATION, Minato-ku (JP)

( * ) Notice: Subject to any disclaimer, the term of this patent is extended or adjusted under 35 U.S.C. 154(b) by 75 days.

(21) Appl. No.: 16/569,319

(22) Filed: Sep. 12, 2019

(65) Prior Publication Data
US 2020/0295169 A1 Sep. 17, 2020

(30) Foreign Application Priority Data
Mar. 14, 2019 (JP) .............................. JP2019-046606

(51) Int. Cl.
*H01L 29/778* (2006.01)
*H01L 29/06* (2006.01)
(Continued)

(52) U.S. Cl.
CPC ...... *H01L 29/7783* (2013.01); *H01L 29/0653* (2013.01); *H01L 29/2003* (2013.01);
(Continued)

(58) Field of Classification Search
CPC ............... H01L 29/7786; H01L 29/778; H01L 29/2003; H01L 29/7783; H01L 29/4236; H01L 29/66462
(Continued)

(56) References Cited

U.S. PATENT DOCUMENTS 8,674,407 B2   3/2014  Ando et al.
9,190,508 B2  11/2015  Saito et al.
(Continued)

FOREIGN PATENT DOCUMENTS

JP    2012-54471 A    3/2012
JP    2014-207287 A  10/2014
(Continued)

OTHER PUBLICATIONS

Nakazawa, S. et al., "Fast Switching Performance by 20 A / 730 V AlGaN/GaN MIS-HFET Using AlON Gate Insulator," 978-1-5386-3559-9, 2017, IEEE, IEDM17-605-IEDM17-608, 4 total pages.
(Continued)

*Primary Examiner* — Didarul A Mazumder
(74) *Attorney, Agent, or Firm* — Oblon, McClelland, Maier & Neustadt, L.L.P.

(57) ABSTRACT

According to one embodiment, a semiconductor device includes first to third electrodes, first to third nitride regions, and first and second insulating films. The first nitride region includes $Al_{x1}Ga_{1-x1}N$, and includes first and second partial regions, a third partial region between the first and second partial regions, a fourth partial region between the first and third partial regions, and a fifth partial region between the third and second partial regions. The first nitride region includes first to fifth partial regions. The second nitride region includes $Al_{x2}Ga_{1-x2}N$, and sixth and seventh partial regions. At least a portion of the third electrode is between the sixth and seventh partial regions. The first insulating film
(Continued)

includes silicon and oxygen and includes first and second insulating regions. The third nitride region includes $Al_{x3}Ga_{1-x3}N$, and first to seventh portions. The second insulating film includes silicon and oxygen and includes third to seventh insulating regions.

20 Claims, 8 Drawing Sheets

(51) Int. Cl.
| | |
|---|---|
| *H01L 29/205* | (2006.01) |
| *H01L 29/20* | (2006.01) |
| *H01L 29/66* | (2006.01) |
| *H01L 29/423* | (2006.01) |

(52) U.S. Cl.
CPC ........ *H01L 29/205* (2013.01); *H01L 29/2006* (2013.01); *H01L 29/4236* (2013.01); *H01L 29/66462* (2013.01)

(58) Field of Classification Search
USPC .......................................................... 257/76
See application file for complete search history.

(56) References Cited

U.S. PATENT DOCUMENTS

| | | |
|---|---|---|
| 9,337,332 B2 | 5/2016 | Chu et al. |
| 2012/0056191 A1 | 3/2012 | Endo et al. |
| 2013/0001646 A1* | 1/2013 | Corrion ............ H01L 29/66462 257/194 |
| 2013/0240896 A1* | 9/2013 | Ozaki ............... H01L 29/66462 257/76 |
| 2014/0264364 A1 | 9/2014 | Kanamura |
| 2016/0043209 A1 | 2/2016 | Oyama |
| 2016/0233311 A1 | 8/2016 | Masumoto |
| 2017/0077277 A1* | 3/2017 | Saito .................. H01L 29/7786 |

FOREIGN PATENT DOCUMENTS

| | | |
|---|---|---|
| JP | 2014-212340 A | 11/2014 |
| JP | 2015-60896 A | 3/2015 |
| JP | 2016-149404 A | 8/2016 |

OTHER PUBLICATIONS

Christy, D. et al., "Influence of strain induced by AlN nucleation layer on the electrical properties of AlGaN/GaN heterostructures on Si(111) substrate," AIP Advances 4, 107104, 2014, doi: 10.1063/1.4897338, https://aip.scitation.org/doi/10.1063/1.4897338, 9 total pages.

* cited by examiner

SEMICONDUCTOR DEVICE INCLUDING DIFFERENT NITRIDE REGIONS AND METHOD FOR MANUFACTURING SAME

CROSS-REFERENCE TO RELATED APPLICATIONS

This application is based upon and claims the benefit of priority from Japanese Patent Application No. 2019-046606, filed on Mar. 14, 2019; the entire contents of which are incorporated herein by reference.

FIELD

Embodiments described herein relate generally to a semiconductor device and a method for manufacturing the same.

BACKGROUND

For example, there is a semiconductor device that uses a nitride semiconductor. It is desirable to improve the characteristics of the semiconductor device.

DETAILED DESCRIPTION

Figure 1A:
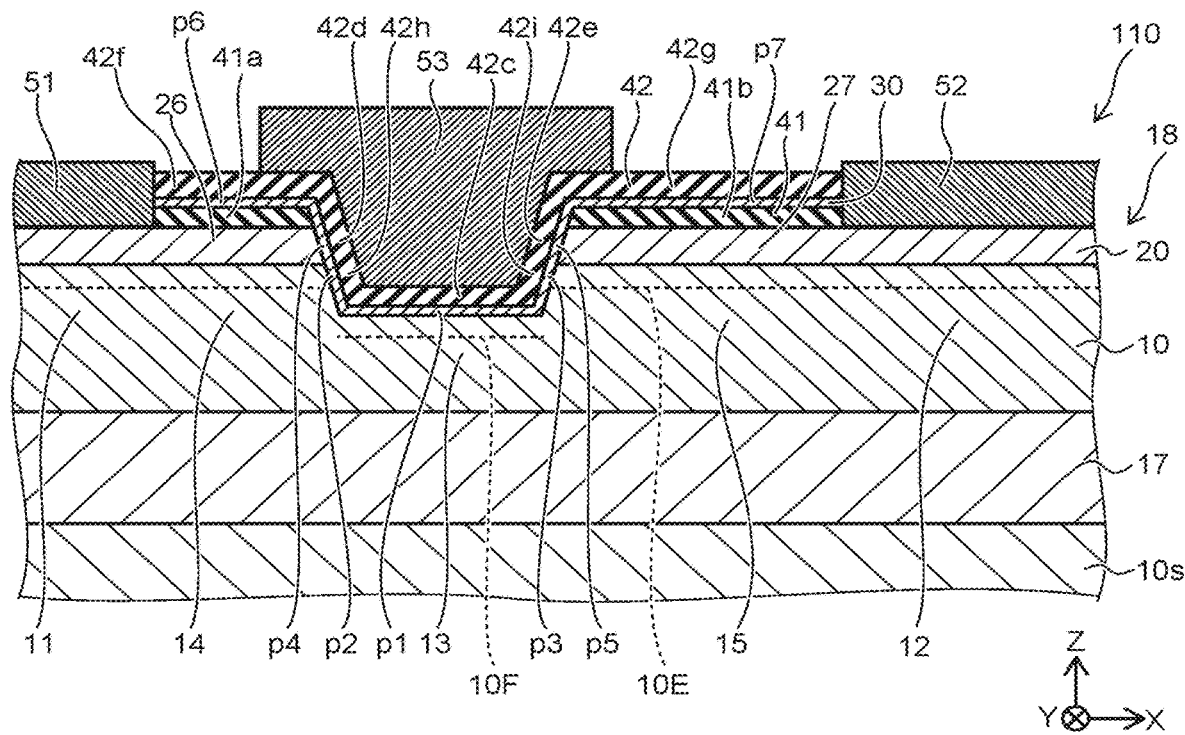
FIG. 1A and FIG. 1B are schematic cross-sectional views illustrating a semiconductor device according to a first embodiment.

According to one embodiment, a semiconductor device includes first to third electrodes, first to third nitride regions, first and second insulating films, and first and second insulating films. The first nitride region includes $Al_{x1}Ga_{1-x1}N$ ($0 \leq x1 < 1$) and includes a first partial region, a second partial region, a third partial region between the first partial region and the second partial region, a fourth partial region between the first partial region and the third partial region, and a fifth partial region between the third partial region and the second partial region. A first direction from the first partial region toward the first electrode crosses a second direction from the first electrode toward the second electrode. A direction from the second partial region toward the second electrode is aligned with the first direction. The second nitride region includes $Al_{x2}Ga_{1-x2}N$ ($0 < x2 \leq 1$ and $x1 < x2$) and includes a sixth partial region and a seventh partial region. A direction from the fourth partial region toward the sixth partial region is aligned with the first direction. A direction from the fifth partial region toward the seventh partial region is aligned with the first direction. A direction from the third partial region toward the third electrode is aligned with the first direction. At least a portion of the third electrode is between the sixth partial region and the seventh partial region in the second direction. The first insulating film includes silicon and nitrogen and includes a first insulating region and a second insulating region. The third nitride region includes $Al_{x3}Ga_{1-x3}N$ ($0 < x3 \leq 1$ and $x1 < x3$) and includes first to seventh portions. The first portion is between the third electrode and the third partial region. The second portion is between the third electrode and the fourth partial region. The third portion is between the third electrode and the fifth partial region. The fourth portion is between the third electrode and the sixth partial region. The fifth portion is between the third electrode and the seventh partial region. The first insulating region is between the sixth portion and the sixth partial region. The second insulating region is between the seventh portion and the seventh partial region. The second insulating film includes silicon and oxygen and includes third to seventh insulating regions. The third insulating region is between the first portion and the third electrode. The fourth insulating region is between the fourth portion and the third electrode. The fifth insulating region is between the fifth portion and the third electrode. The sixth portion is between the sixth insulating region and the first insulating region. The seventh portion is between the seventh insulating region and the second insulating region.

According to one embodiment, a method for manufacturing a semiconductor device is disclosed. The method can include preparing a stacked body including a first nitride region, a second nitride region, and a first insulating film. The first nitride region includes $Al_{x1}Ga_{1-x1}N$ ($0 \leq x1 < 1$). The second nitride region includes $Al_{x2}Ga_{1-x2}N$ ($0 < x2 \leq 1$ and $x1 < x2$). The second nitride region is provided between the first nitride region and the first insulating film. The method can include exposes a portion of the first nitride region at a bottom portion of a recess by forming the recess in the stacked body by removing a portion of the stacked body from the first insulating film side. The method can forming a third nitride region at the first insulating film, at a side surface of the second nitride region, and at the first nitride region exposed at the bottom portion of the recess. The third nitride region includes $Al_{x3}Ga_{1-x3}N$ ($0 < x3 \leq 1$ and $x1 < x3$). The method can include forming a second insulating film after the forming of the third nitride region, and forming first to third electrodes after the forming of the second insulating film. A second direction from the first electrode toward the second electrode crosses a first direction from the first nitride region toward the second nitride region. A position in the second direction of the third electrode is between a position in the second direction of the first electrode and a position in the second direction of the second electrode. At least a portion of the third electrode is in a remaining space of the recess.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

Figure 1B:
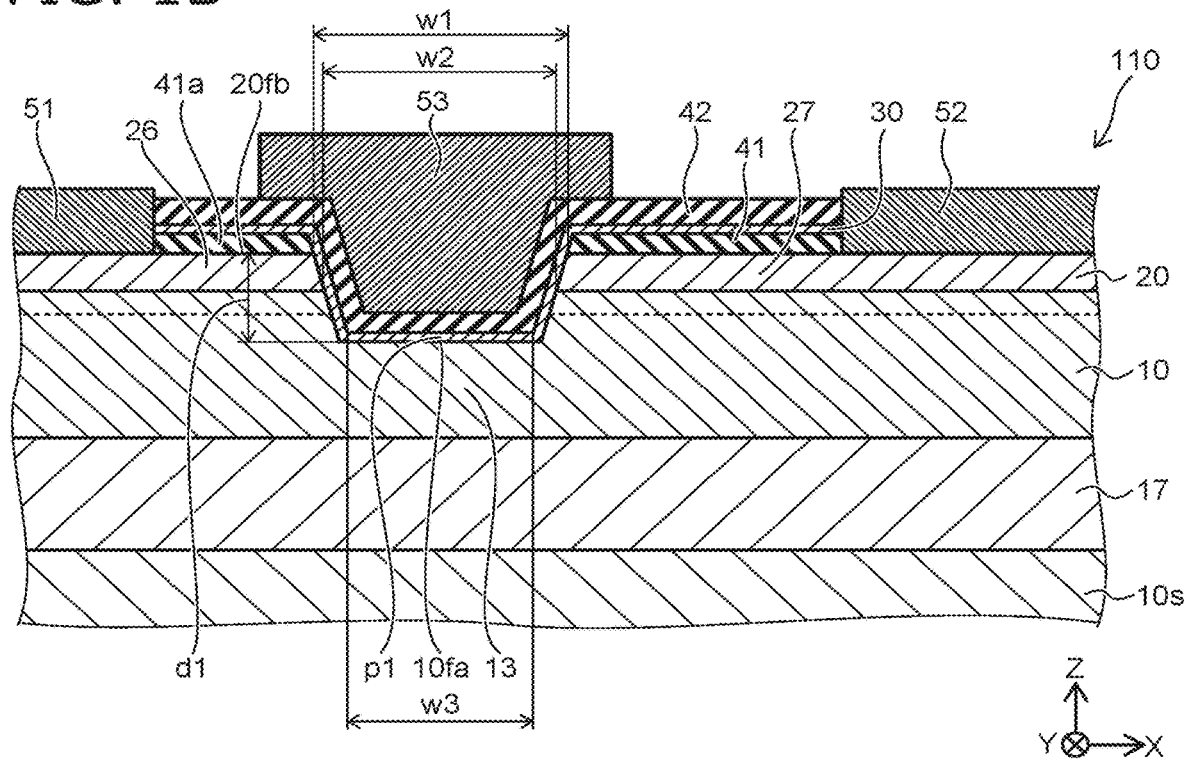

FIG. 1A and FIG. 1B are schematic cross-sectional views illustrating a semiconductor device according to a first embodiment.

As shown in FIG. 1A, the semiconductor device 110 according to the embodiment includes a first electrode 51, a second electrode 52, a third electrode 53, a first nitride region 10, a second nitride region 20, a third nitride region 30, a first insulating film 41, and a second insulating film 42.

The first nitride region 10 includes $Al_{x1}Ga_{1-x1}N$ (0≤x1<1). The composition ratio x1 of Al is, for example, not less than 0 and not more than 0.05. The first nitride region 10 includes, for example, GaN. The first nitride region 10 is, for example, a semiconductor region. The first nitride region 10 includes, for example, a crystal.

The first nitride region 10 includes, for example, first to fifth partial regions 11 to 15. The third partial region 13 is between the first partial region 11 and the second partial region 12. The fourth partial region 14 is between the first partial region 11 and the third partial region 13. The fifth partial region 15 is between the third partial region 13 and the second partial region 12. For example, the first to fifth partial regions 11 to 15 are continuous with each other.

A first direction from the first partial region 11 toward the first electrode 51 crosses a second direction from the first electrode 51 toward the second electrode 52.

The second direction is, for example, an X-axis direction. One direction perpendicular to the X-axis direction is taken as a Z-axis direction. A direction perpendicular to the X-axis direction and the Z-axis direction is taken as a Y-axis direction.

The first direction is, for example, the Z-axis direction.

The direction from the second partial region 12 toward the second electrode 52 is aligned with the first direction (e.g., the Z-axis direction).

The second nitride region 20 includes $Al_{x2}Ga_{1-x2}N$ (0<x2≤1 and x1<x2). The second nitride region 20 includes AlGaN. For example, the composition ratio x2 of Al is not less than 0.05 and not more than 0.3. In one example, the second nitride region 20 includes, for example, $Al_{0.3}Ga_{0.7}N$. The second nitride region 20 is, for example, a semiconductor region. The second nitride region 20 includes, for example, a crystal.

The second nitride region 20 includes a sixth partial region 26 and a seventh partial region 27. The direction from the fourth partial region 14 toward the sixth partial region 26 is aligned with the first direction (e.g., the Z-axis direction). The direction from the fifth partial region 15 toward the seventh partial region 27 is aligned with the first direction.

The direction from the third partial region 13 toward the third electrode 53 is aligned with the first direction (e.g., the Z-axis direction). At least a portion of the third electrode 53 is between the sixth partial region 26 and the seventh partial region 27 in the second direction (the X-axis direction).

The first insulating film 41 includes a first insulating region 41a and a second insulating region 41b. The first insulating film 41 includes silicon and nitrogen. In one example, the first insulating film 41 includes SiN.

The third nitride region 30 includes $Al_{x3}Ga_{1-x3}N$ (0<x3≤1 and x1<x3). For example, the composition ratio x3 of Al in the third nitride region 30 is higher than the composition ratio x2 of Al in the second nitride region 20. In one example, the composition ratio x3 of Al is, for example, greater than 0.3 and not more than 1. For example, the third nitride region 30 includes, for example, AlN. The third nitride region 30 is, for example, a semiconductor region. As described below, the crystallinity of the third nitride region 30 may be different by location.

The third nitride region 30 includes first to seventh portions p1 to p7. The first portion p1 is between the third electrode 53 and the third partial region 13 in the first direction (e.g., the Z-axis direction). The second portion p2 is between the third electrode 53 and the fourth partial region 14 in the second direction (the X-axis direction). The third portion p3 is between the third electrode 53 and the fifth partial region 15 in the second direction (the X-axis direction). The fourth portion p4 is between the third electrode 53 and the sixth partial region 26 in the second direction (the X-axis direction). The fifth portion p5 is between the third electrode 53 and the seventh partial region 27 in the second direction (the X-axis direction). The first insulating region 41a is between the sixth portion p6 and the sixth partial region 26. The second insulating region 41b is between the seventh portion p7 and the seventh partial region 27. For example, the first to seventh portions p1 to p7 are continuous with each other.

The second insulating film 42 includes silicon and oxygen. The second insulating film 42 includes, for example, silicon oxide. The second insulating film 42 includes, for example, $SiO_2$. In one example, the second insulating film 42 does not include nitrogen. For example, the concentration of nitrogen included in the second insulating film 42 may be lower than the concentration of nitrogen included in the first insulating film 41.

The second insulating film 42 includes third to seventh insulating regions 42c to 42g. The third insulating region 42c is between the first portion p1 and the third electrode 53 in the first direction (e.g., the Z-axis direction). The fourth insulating region 42d is between the fourth portion p4 and the third electrode 53 in the second direction (the X-axis direction). The fifth insulating region 42e is between the fifth portion p5 and the third electrode 53 in the second direction (the X-axis direction). The sixth portion p6 is between the sixth insulating region 42f and the first insulating region 41a in the first direction (e.g., the Z-axis direction). The seventh portion p7 is between the seventh insulating region 42g and the second insulating region 41b in the first direction (e.g., the Z-axis direction).

The second insulating film 42 may further include an eighth insulating region 42h and a ninth insulating region 42i. The eighth insulating region 42h is between the fourth portion p4 and the third electrode 53 in the second direction (the X-axis direction). The ninth insulating region 42i is between the fifth portion p5 and the third electrode 53.

For example, the first nitride region 10 and the second nitride region 20 are included in a stacked body 18. For example, the stacked body 18 is provided on a base body 10s. For example, a buffer layer 17 is formed on the base body 10s. The first nitride region 10 is epitaxially grown on the buffer layer 17. The second nitride region 20 is epitaxially grown on the first nitride region 10. The first insulating film 41 is formed on the second nitride region 20. The stacked body 18 may include the first insulating film 41. For example, a recess (a recess or a trench) is formed by removing a portion of the stacked body 18 via the opening of the first insulating film 41. The bottom portion of the recess is positioned inside the first nitride region 10. The third nitride region 30 is provided at the bottom surface of the recess (a portion of the first nitride region 10), at the side surface of the recess (a portion of the first nitride region 10 and a portion of the second nitride region 20), and at the surface (e.g., the upper surface) of the stacked body 18. For example, at least a portion of the third nitride region 30 is epitaxially grown. The third nitride region 30 is, for example, a regrowth layer. The second insulating film 42 is formed after the formation of the third nitride region 30. For example, the first to third electrodes 51 to 53 are formed. The semiconductor device 110 is obtained thereby.

The first electrode 51 functions as, for example, a source electrode. The second electrode 52 functions as, for example, a drain electrode. The third electrode 53 functions as, for example, a gate electrode. The second insulating film 42 functions as, for example, a gate insulating film. The first insulating film 41 functions as, for example, a protective film. For example, the current (the drain current) that flows between the first electrode 51 and the second electrode 52 can be controlled by the potential (e.g., the gate voltage) of the third electrode 53. For example, the gate voltage is the potential of the third electrode 53 referenced to the potential of the first electrode 51.

For example, a two-dimensional electron gas 10E is generated at, for example, a portion of the first nitride region 10 on the second nitride region 20 side. The two-dimensional electron gas 10E is used as a carrier region. The semiconductor device 110 is, for example, a HEMT (High Electron Mobility Transistor).

In the semiconductor device 110 according to the embodiment, the first portion p1 of the third nitride region 30 is provided between the third electrode 53 and the third partial region 13 in the Z-axis direction. For example, a two-dimensional electron gas 10F is formed in a portion of the first partial region 11 on the first portion p1 side. Thereby, for example, a high channel mobility is obtained.

In the embodiment, the third nitride region 30 includes side surface portions (e.g., second to fifth portions p2 to p5) of the recess and portions (the sixth portion p6 and the seventh portion p7) on the second nitride region 20 in addition to the first portion p1 on the third partial region 13 (e.g., GaN). These portions are continuous. By providing such a third nitride region 30, for example, good crystallinity is obtained easily in the first portion p1. Thereby, for example, the two-dimensional electron gas 10F can be formed stably. A higher channel mobility is obtained stably thereby. According to the embodiment, a semiconductor device can be provided in which the characteristics can be improved stably.

The first insulating film 41 is provided in the embodiment. The upper surface of the second nitride region 20 is protected by the first insulating film 41 when forming the recess. The degradation of the second nitride region 20 can be suppressed.

In the embodiment, the first portion p1 of the third nitride region 30 is provided on the third partial region 13 of the first nitride region 10. Thereby, for example, good crystallinity is obtained easily in the first portion p1.

On the other hand, the sixth portion p6 of the third nitride region 30 is provided on the first insulating region 41a of the first insulating film 41. The seventh portion p7 of the third nitride region 30 is provided on the second insulating region 41b of the first insulating film 41. Thus, the foundation is different between the first portion p1 and the sixth portion p6. The foundation is different between the first portion p1 and the seventh portion p7. Therefore, the crystallinity, etc., may be different between these portions.

Figure 2A:
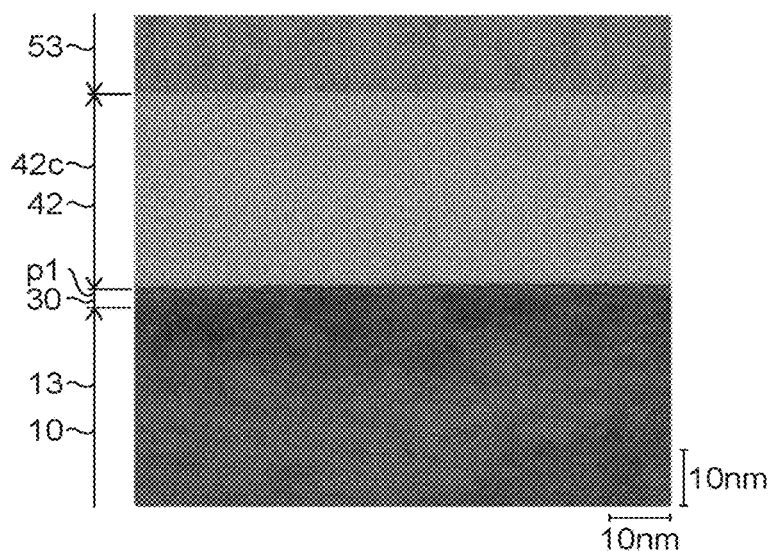
FIG. 2A to FIG. 2C are schematic views illustrating the semiconductor device according to the first embodiment.
Figure 2B:
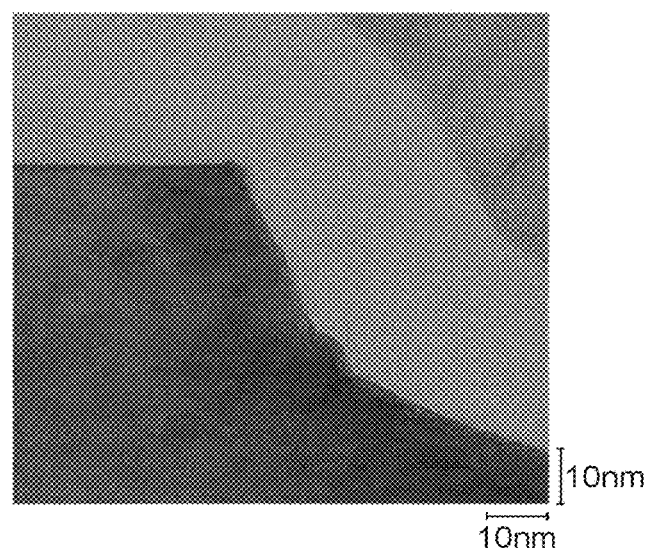
Figure 2C:
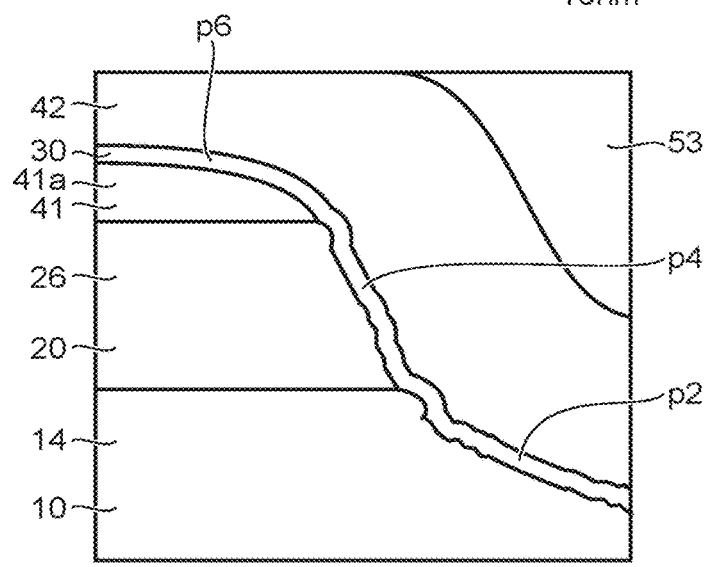
Figure 3A:
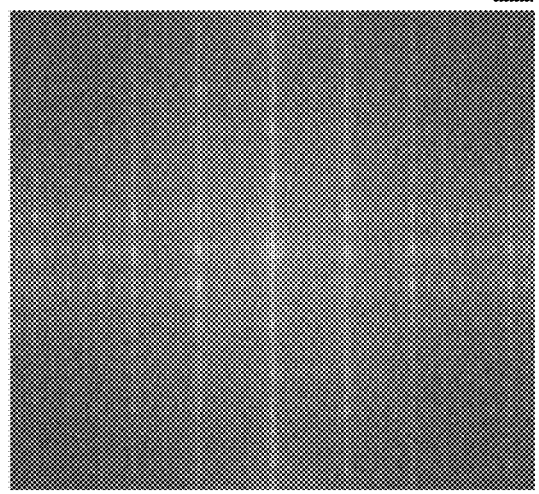
FIG. 3A to FIG. 3D illustrate X-ray diffraction pattern images of the semiconductor device according to the first embodiment.
Figure 3B:
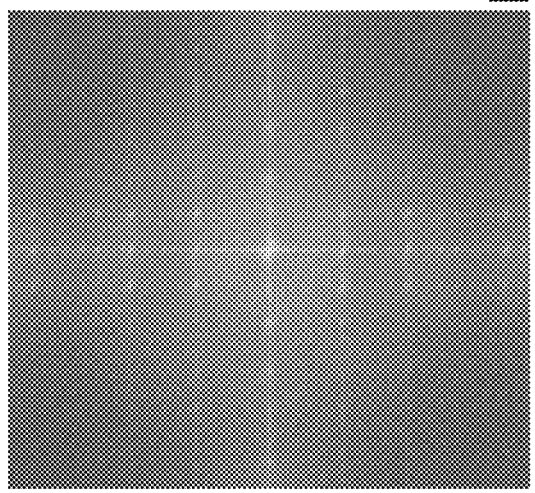
Figure 3C:
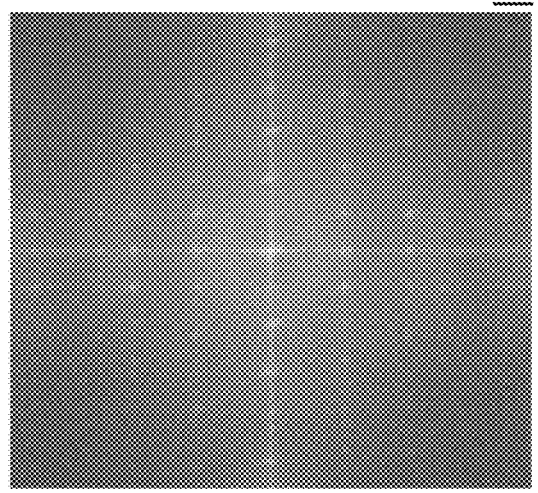
Figure 3D:
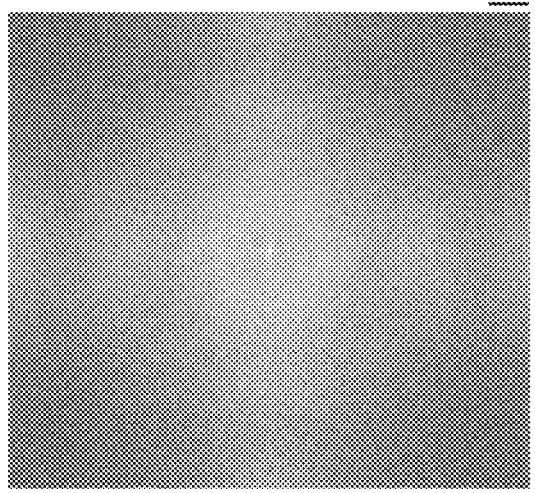

FIG. 2A to FIG. 2C are schematic views illustrating the semiconductor device according to the first embodiment. FIG. 2A and FIG. 2B are STEM (Scanning Transmission Electron Microscope) images of the semiconductor device 110. FIG. 2A corresponds to a region including the first portion p1. FIG. 2B corresponds to a region including the second portion p2, the fourth portion p4, and the sixth portion p6. FIG. 2C shows the relationship between the region shown in FIG. 2A and the regions (the nitride regions, etc.) included in the semiconductor device 110.

FIG. 3A to FIG. 3D illustrate X-ray diffraction pattern images of the semiconductor device according to the first embodiment.

FIG. 3A to FIG. 3D correspond respectively to the first portion p1, the second portion p2, the fourth portion p4, and the sixth portion p6.

It can be seen from FIG. 2A, FIG. 2B, and FIG. 3A to FIG. 3D that the crystallinities of the multiple regions included in the third nitride region 30 are different from each other. For example, the crystallinity of the first portion p1 is higher than the crystallinity of the sixth portion p6. The crystallinity of the first portion p1 is higher than the crystallinity of the seventh portion p7. For example, a high channel mobility is obtained easily because the crystallinity of the first portion p1 is high.

For example, at least a portion of the first portion p1 includes a crystal. At least a portion of the sixth portion p6 may be amorphous. At least a portion of the seventh portion p7 may be amorphous.

The side surface portion (e.g., the second portion p2) of the third nitride region 30 is formed on a nitride semiconductor. Therefore, the crystallinity of this side surface portion is relatively high. For example, the crystallinity of the second portion p2 is higher than the crystallinity of the sixth portion p6. For example, the crystallinity of the second portion p2 is higher than the crystallinity of the fourth portion p4. For example, the crystallinity of the third portion p3 is higher than the crystallinity of the seventh portion p7. For example, the crystallinities of the first portion p1 and the second portion p2 are higher than the crystallinities of the fourth portion p4 and the fifth portion p5.

The fourth portion p4 is formed on a nitride semiconductor. Therefore, the crystallinity of the fourth portion p4 is relatively high. For example, the crystallinity of the fourth portion p4 is higher than the crystallinity of the sixth portion p6. For example, the crystallinity of the fifth portion p5 is higher than the crystallinity of the seventh portion p7.

In the embodiment, in the X-axis direction, the third electrode 53 opposes a portion of the first nitride region 10 and opposes the second nitride region 20. The third electrode 53 is, for example, a recessed gate electrode. For example, the two-dimensional electron gas 10E under the second nitride region 20 is divided by the third electrode 53 and the second insulating film 42 (the gate insulating film). Thereby, the threshold voltage can be high; and it is easy to obtain normally-off characteristics stably.

From experiments by the inventor, it was found that the threshold voltage changes according to a gate length Lg and the depth of the recess recited above. An example of the experimental results will now be described.

As shown in FIG. 1B, the third partial region 13 includes a first surface 10fa opposing the first portion p1. The sixth partial region 26 includes a second surface 20fb opposing the first insulating region 41a. The first surface 10fa corresponds to the bottom surface (the lower surface) of the recess. The second surface 20fb corresponds to the upper surface of the second nitride region 20.

The distance along the first direction (the Z-axis direction) between the position along the first direction (the Z-axis direction) of the first surface 10fa and the position along the first direction (the Z-axis direction) of the second surface 20fb is taken as a distance d1. The distance d1 corresponds to the depth of the recess (the recess depth).

As shown in FIG. 1B, the distance along the second direction (the X-axis direction) between the first insulating region 41a and the second insulating region 41b is taken as a distance w1. The distance along the second direction (the X-axis direction) between the sixth partial region 26 and the seventh partial region 27 is taken as a distance w2. The distance along the second direction (the X-axis direction) between the second portion p2 and the third portion p3 is taken as a distance w3. In the case where the side surface of the recess is perpendicular, these distances are substantially the same. For example, these distances correspond to the gate length Lg. These distances are large compared to the differences between these distances due to the oblique side surface. Therefore, practically, any of these distances may be used as the gate length Lg. Hereinbelow, the gate length Lg is the distance w2.

In the samples of the experiment, the first nitride region 10 is GaN. The second nitride region 20 is $Al_{0.25}Ga_{0.75}N$. The thickness (the length in the Z-axis direction) of the second nitride region 20 is 30 nm. The third nitride region 30 is AlN. The thickness of the third nitride region 30 (e.g., the length in the Z-axis direction of the first portion p1) is 0.5 nm. The first insulating film 41 is SiN. The thickness (the length in the Z-axis direction) of the first insulating film 41 is 10 nm. The second insulating film 42 is $SiO_2$. The thickness of the second insulating film 42 (e.g., the length in the Z-axis direction of the third insulating region 42c) is 30 nm. The first to third electrodes 51 to 53 include TiN.

Multiple samples are made in which the depth of the recess (the distance d1) and the gate length Lg are modified. The threshold voltage and the channel mobility are evaluated for these samples.

Figure 4:
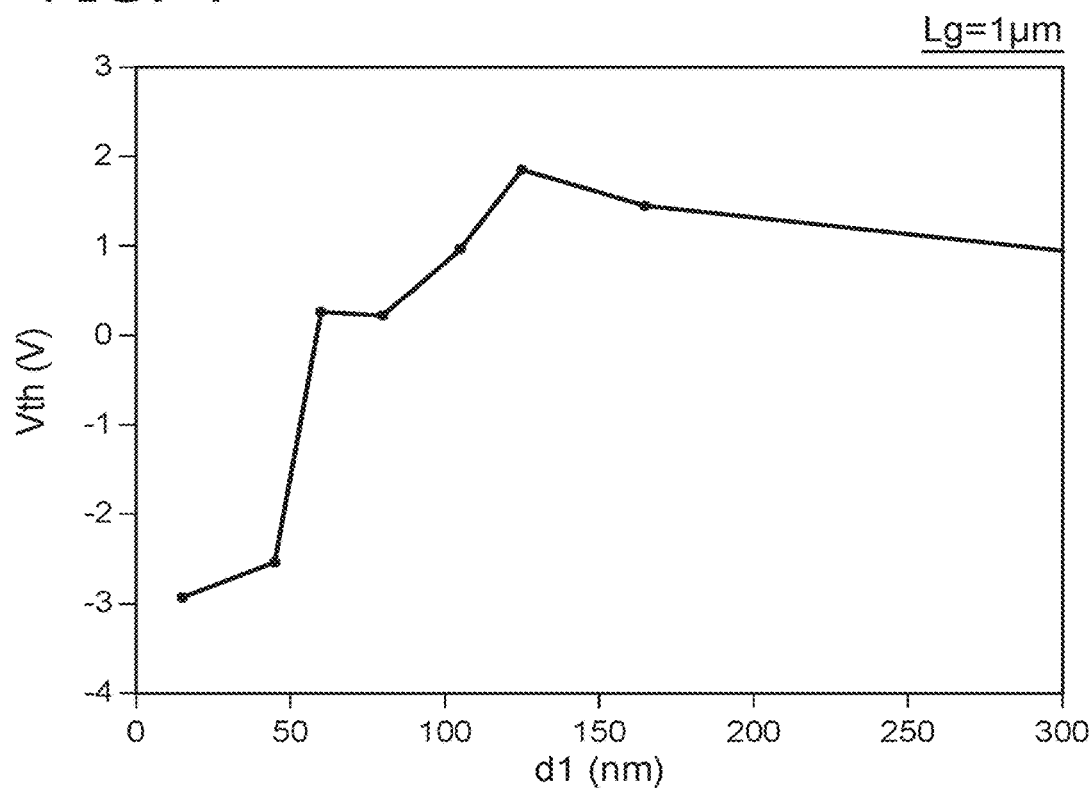
FIG. 4 is a graph illustrating characteristics of the semiconductor device.
Figure 5:
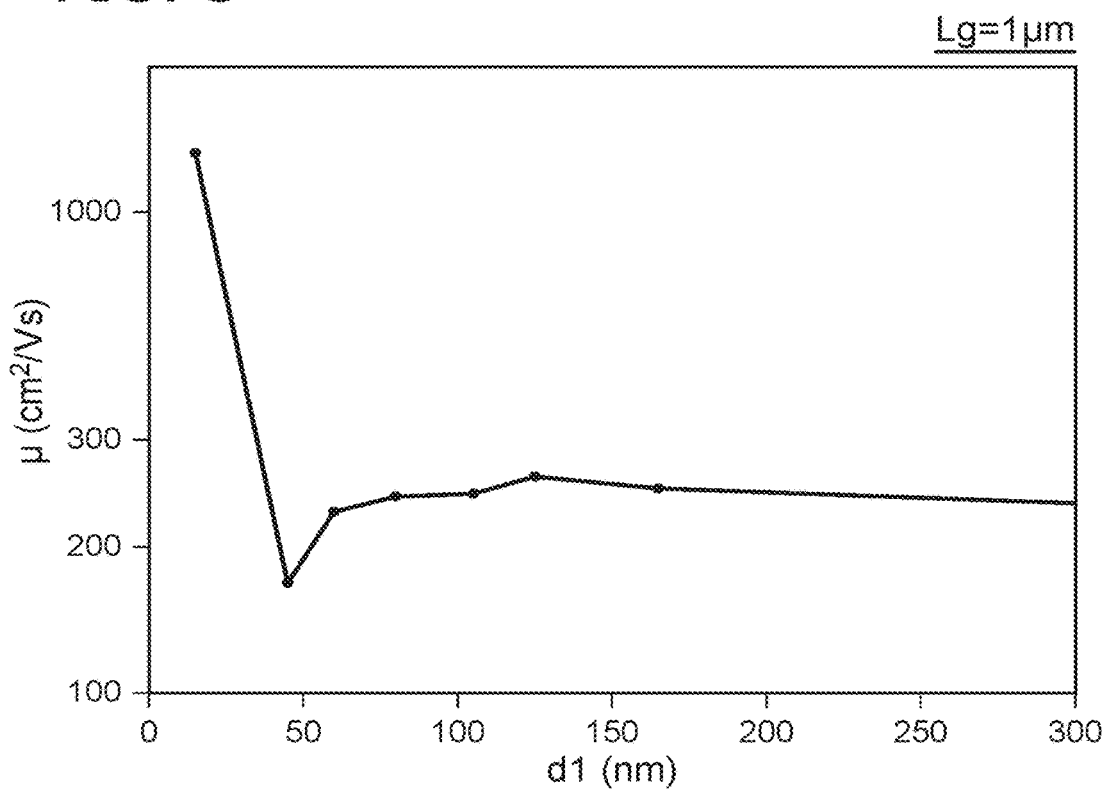
FIG. 5 is a graph illustrating characteristics of the semiconductor device.

FIG. 4 and FIG. 5 are graphs illustrating characteristics of the semiconductor device.

These drawings show the measurement results of the characteristics of samples in which the gate length Lg is 1 μm. In the samples, the channel width "Wg" is 20 μm. For example, "Wg" corresponds to the length in the Y-axis direction of the mutually-opposing portions of the first electrode 51 and the second electrode 52. In these drawings, the horizontal axis is the distance d1 (nm; the depth of the recess). The vertical axis of FIG. 4 is a threshold voltage Vth (V). The threshold voltage Vth corresponds to a gate voltage at which the drain current becomes $1\times10^{-6}$ A. In the example, "Id/Wg" is $5\times10^{-4}$ A/mm when the drain current is $1\times10^{-6}$ A, wherein "Id" is the drain current, and "Wg" is the channel width Wg. The vertical axis of FIG. 5 is a channel mobility μ ($cm^2$/Vs; the field effect mobility). The vertical axis of FIG. 5 is a logarithmic display.

It can be seen from FIG. 4 that the threshold voltage Vth is negative when the distance d1 (the depth of the recess) is short such as 15 nm. In such a case, a normally-on operation is obtained. The threshold voltage Vth increases and becomes positive as the distance d1 lengthens. In such a case, a normally-off operation is obtained. It can be seen from FIG. 4 that the threshold voltage Vth increases abruptly when the distance d1 exceeds 50 nm. A high positive threshold voltage Vth is obtained when the distance d1 is 60 nm or more. It is favorable for the distance d1 to be 80 nm or more. A high positive threshold voltage Vth is obtained stably. It is favorable for the distance d1 to be 100 nm or more. A high positive threshold voltage Vth is obtained more stably.

In the embodiment, for example, as recited above, a direction crossing a plane including the first direction and the second direction is taken as the third direction. The third direction is, for example, the Y-axis direction. In such a case, the length along the third direction of the portion of one of the first electrode 51 or the second electrode 52 opposing the other of the first electrode 51 or the second electrode 52 is taken as Wg (meters). The current that flows between the first electrode 51 and the second electrode 52 is taken as Id (amperes). In the embodiment, the potential (e.g., the threshold voltage Vth) of the third electrode 53 referenced to the potential of the first electrode 51 is positive when Id/Wg is $5\times10^{-4}$ A/mm. The potential of the third electrode 53 referenced to the potential of the first electrode 51 is positive when Id/Wg is $5\times10^{-4}$ A/mm or more.

It can be seen from FIG. 5 that a high channel mobility is obtained when the distance d1 (the depth of the recess) is short such as 15 nm. However, in such a case, the threshold voltage Vth is negative as described in reference to FIG. 4.

On the other hand, as shown in FIG. 5, the channel mobility μ substantially does not change in the range in which the distance d1 is 60 nm to 300 nm.

In the embodiment, it is favorable for the distance d1 to be 60 nm or more. Thereby, a high positive threshold voltage Vth and a relatively high and stable channel mobility μ are obtained.

In the example recited above, the thickness of the second nitride region 20 is 30 nm. In the embodiment, it is favorable for the distance d1 to be not less than 2 times the thickness of the second nitride region 20. It is favorable for the distance d1 to be not less than 2.5 times the thickness of the second nitride region 20. It is more favorable for the distance d1 to be not less than 3 times the thickness of the second nitride region 20. It is more favorable for the distance d1 to be not less than 3.3 times the thickness of the second nitride region 20.

An example of measurement results of the threshold voltage Vth will now be described for samples in which the gate length Lg is changed.

FIG. 6A to FIG. 6D are graphs illustrating characteristics of the semiconductor device.

In these drawings, the horizontal axis is the gate length Lg (μm). The vertical axis is the threshold voltage Vth. FIG. 6A to FIG. 6D correspond respectively to the results when the distance d1 is 45 nm, 100 nm, 120 nm, and 160 nm.

Figure 6A:
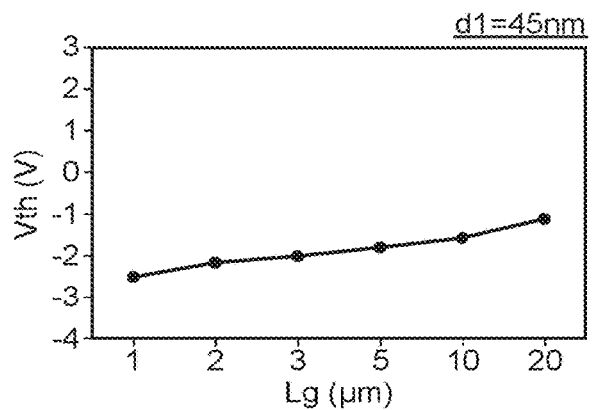
FIG. 6A to FIG. 6D are graphs illustrating characteristics of the semiconductor device.
Figure 6B:
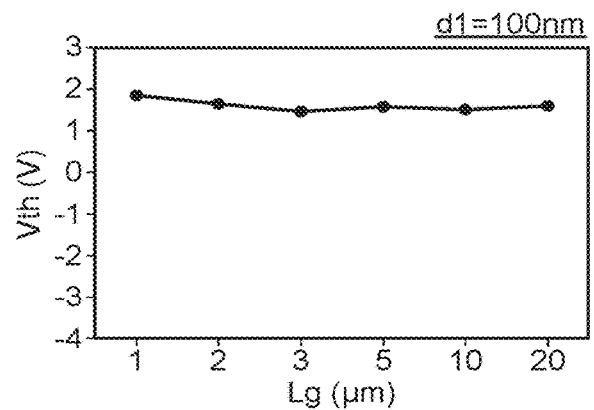
Figure 6C:
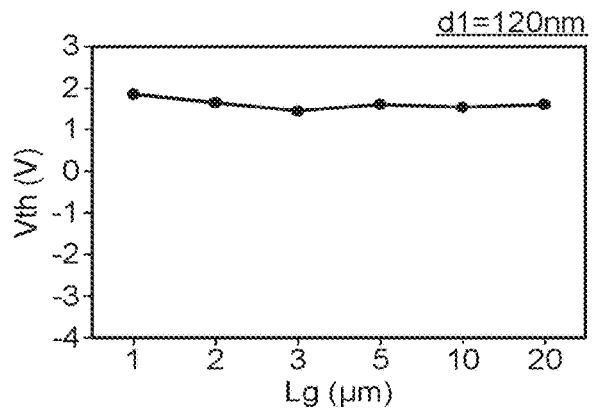
Figure 6D:
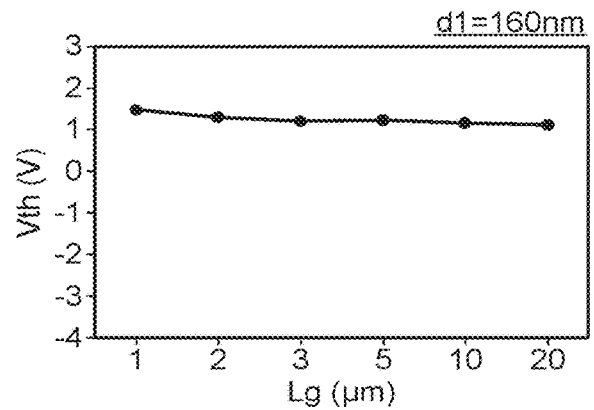

In the case where the distance d1 is 45 nm as shown in FIG. 6A, the threshold voltage Vth decreases as the gate length Lg decreases. It is considered that this corresponds to a phenomenon generally known as a "short-channel effect." On the other hand, in the case where the distance d1 is 100 nm, 120 nm, and 160 nm as shown in FIG. 6B to FIG. 6D, the threshold voltage Vth increases as the gate length Lg decreases in the range in which the gate length Lg is 1 μm to 3 μm. Such a phenomenon is conventionally-unknown. It is considered that this phenomenon occurs uniquely when the distance d1 (the depth of the recess) is long.

In the embodiment, it is more favorable for the gate length Lg to be 3 μm or less. Thereby, for example, a high threshold voltage Vth is obtained easily.

In the embodiment, it is favorable for the impurity to be low at the bottom portion of the recess. For example, the formation of the recess is performed by dry etching using a gas including, for example, at least one selected from the group consisting of $BCl_3$ and $Cl_2$. For example, there are cases where the channel mobility μ may decrease if the element included in the gas remains in the third partial region 13. For example, the concentration of the element included in the gas may be reduced by performing the heat treatment in an atmosphere of ammonia, etc., after the formation of the recess.

For example, the third partial region 13 includes a region including the first surface 10fa (referring to FIG. 1B) opposing the first portion p1. The concentration of boron in this region including the first surface 10fa is, for example, $1 \times 10^{18}$ atoms/cm$^3$ or less. The concentration of boron in the region including the first surface 10fa is, for example, about $9 \times 10^{17}$ atoms/cm$^3$. The concentration of boron in the region including the first surface 10fa is, for example, $1 \times 10^{16}$ atoms/cm$^3$ or more.

The concentration of chlorine in the region including the first surface 10fa is, for example, $1 \times 10^{16}$ atoms/cm$^3$ or less. The concentration of chlorine in the region including the first surface 10fa is, for example, about $4 \times 10^{15}$ atoms/cm$^3$. The concentration of chlorine in the region including the first surface 10fa is, for example, not less than about $1 \times 10^{15}$ atoms/cm$^3$.

It is favorable for the first surface 10fa to be flat. For example, the flatness of the first surface 10fa is improved by performing the heat treatment in an atmosphere of the ammonia, etc., after the formation of the recess. For example, the surface roughness (e.g., the root mean square RMS) of the first surface 10fa is 1 nm or less. The surface roughness of the first surface 10fa is, for example, about 202 μm.

The surface of the first surface 10fa (the surface of the third partial region 13) is relatively flat (referring to FIG. 2A). The surface of the first portion p1 of the third nitride region 30 also is relatively flat (referring to FIG. 2A). On the other hand, the unevenness of the surface of the side surface portion (e.g., the fourth portion p4, etc.) of the third nitride region 30 is larger than the unevenness of the surface of the first portion p1.

Second Embodiment

A second embodiment relates to a method for manufacturing a semiconductor device.

Figure 7:
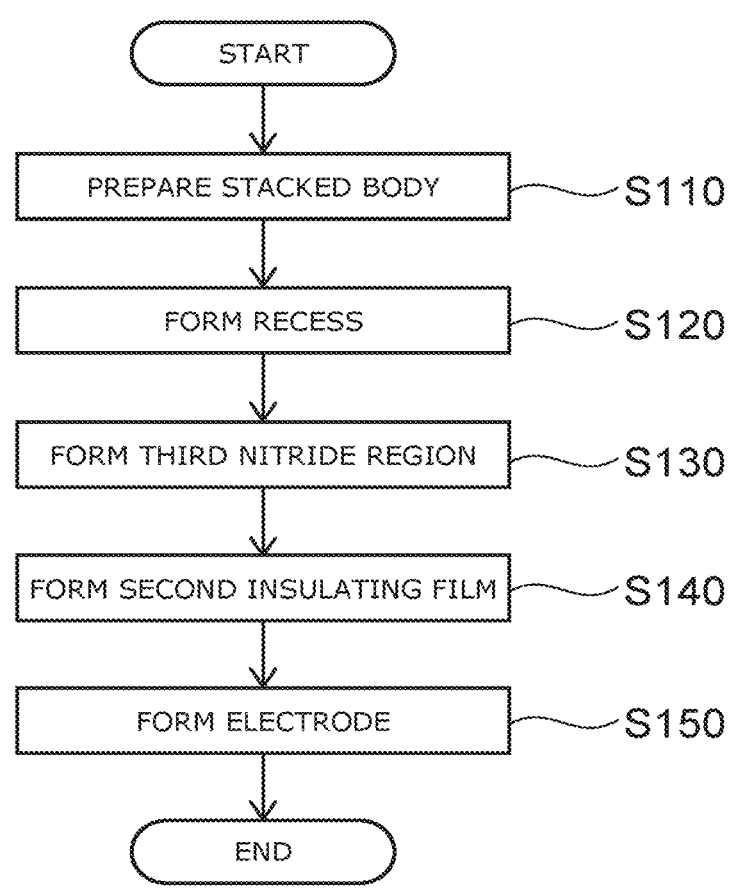
FIG. 7 is a flowchart illustrating the method for manufacturing the semiconductor device according to the second embodiment.

FIG. 7 is a flowchart illustrating the method for manufacturing the semiconductor device according to the second embodiment.

The stacked body 18 is prepared as shown in FIG. 7 (step S110). The stacked body 18 includes the first nitride region 10 including $Al_{x1}Ga_{1-x1}N$ (0≤x1<1), the second nitride region 20 including $Al_{x2}Ga_{1-x2}N$ (0<x2≤1 and x1<x2), and the first insulating film 41. The second nitride region 20 is provided between the first nitride region 10 and the first insulating film 41.

A recess is formed in the stacked body 18 by removing a portion of the stacked body 18 from the first insulating film 41 side (step S120). Also, a portion of the first nitride region 10 is exposed at the bottom portion of the recess.

The third nitride region 30 that includes $Al_{x3}Ga_{1-x3}N$ (0<x3≤1 and x1<x3) is formed (step S130). The third nitride region 30 is formed at the first insulating film 41, at the side surface of the second nitride region 20, and at the first nitride region 10 exposed at the bottom portion of the recess.

The second insulating film 42 is formed after the formation of the third nitride region 30 (step S140).

The electrodes (the first to third electrodes 51 to 53) are formed (step S150). For example, step S150 is performed after the formation of the second insulating film 42 (step S140). The second direction (the X-axis direction) from the first electrode 51 toward the second electrode 52 crosses the first direction (e.g., the Z-axis direction) from the first nitride region 10 toward the second nitride region 20. The position in the second direction of the third electrode 53 is between the position in the second direction of the first electrode 51 and the position in the second direction of the second electrode 52. At least a portion of the third electrode 53 is in the remaining space of the recess.

An example of the method for manufacturing the semiconductor device 110 according to the embodiment will now be described.

FIG. 8A to FIG. 8D and FIG. 9A to FIG. 9D are schematic cross-sectional views in order of the processes, illustrating the method for manufacturing the semiconductor device according to the second embodiment. The buffer layer 17 is not illustrated in these drawings.

Figure 8A:
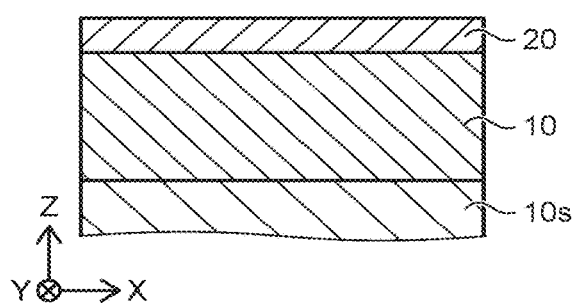
FIG. 8A to FIG. 8D are schematic cross-sectional views in order of the processes, illustrating the method for manufacturing the semiconductor device according to the second embodiment.

As shown in FIG. 8A, the first nitride region 10 is provided on the base body 10s. The second nitride region 20 is provided on the first nitride region 10. The base body 10s is, for example, a silicon substrate.

Figure 8B:
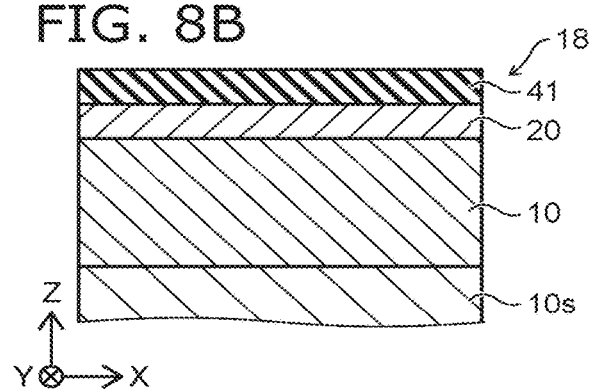

As shown in FIG. 8B, the first insulating film 41 is provided on the second nitride region 20. The stacked body 18 is obtained.

Figure 8C:
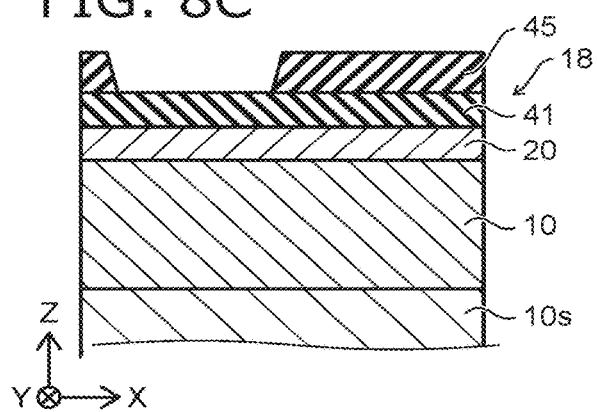

As shown in FIG. 8C, a mask film 45 that has a prescribed opening is formed on the first insulating film 41.

Figure 8D:
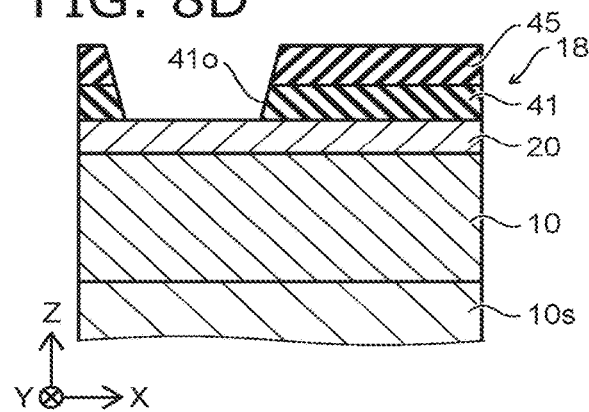

As shown in FIG. 8D, a portion of the first insulating film 41 is removed using the mask film 45 as a mask. An opening 410 is formed in the first insulating film 41 thereby.

Figure 9A:
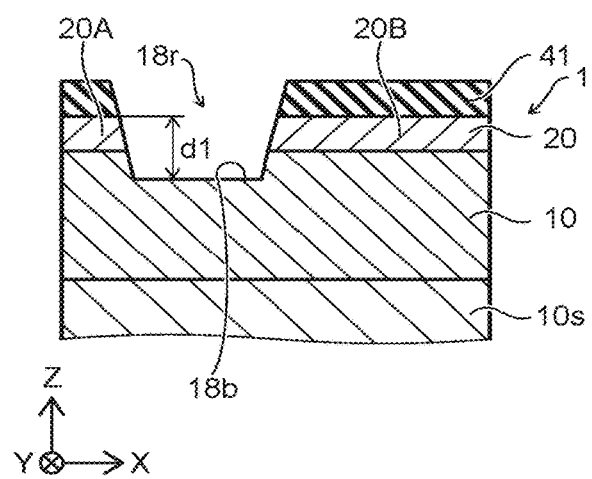
FIG. 9A to FIG. 9D are schematic cross-sectional views in order of the processes, illustrating the method for manufacturing the semiconductor device according to the second embodiment.

As shown in FIG. 9A, a portion of the stacked body 18 is removed using the first insulating film 41 as a mask. A recess 18r is formed in the stacked body 18 (step S120). A portion of the first nitride region 10 is exposed at a bottom portion 18b of the recess 18r.

At this time, the depth of the recess 18r corresponds to the distance d1 in the Z-axis direction between the bottom portion 18b and the upper surface of the second nitride region 20. It is favorable for the distance d1 to be, for example, 60 nm or more. It is favorable for the distance d1 to be, for example, not less than 2 times the thickness of the second nitride region 20.

Figure 9B:
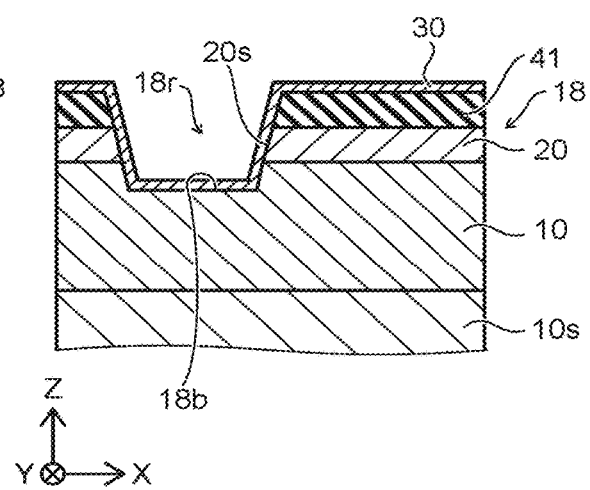

The third nitride region 30 is formed as shown in FIG. 9B (step S130). The third nitride region 30 is formed at the upper surface of the first insulating film 41, at a side surface 20s of the second nitride region 20, and at the first nitride region 10 exposed at the bottom portion 18b of the recess 18r.

Figure 9C:
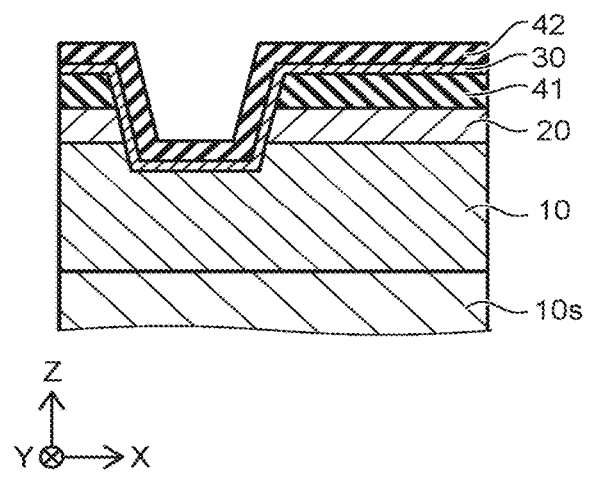

The second insulating film 42 is formed as shown in FIG. 9C.

Figure 9D:
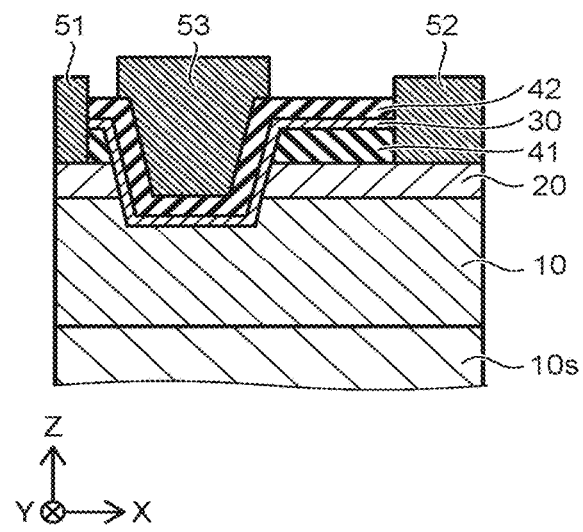

The first to third electrodes 51 to 53 are formed as shown in FIG. 9D. The second direction (the X-axis direction) from the first electrode 51 toward the second electrode 52 crosses the first direction (the Z-axis direction) from the first nitride region 10 toward the second nitride region 20. The position in the second direction of the third electrode 53 is between the position in the second direction of the first electrode 51 and the position in the second direction of the second electrode 52. At least a portion of the third electrode 53 is in the remaining space of the recess 18r. The third electrode 53 opposes the first nitride region 10 in the second direction (the X-axis direction).

In the manufacturing method recited above, the third nitride region 30 is formed at the upper surface of the first insulating film 41, at the side surface 20s of the second nitride region 20, and at the first nitride region 10 exposed at the bottom portion 18b of the recess 18r. Good crystallinity is obtained in the first portion p1 of the third nitride region 30 (referring to FIG. 1A). By forming the recess 18r by using the first insulating film 41, the damage of the second nitride region 20 is low. The third nitride region 30 is protected by forming the second insulating film 42 to cover the third nitride region 30.

According to the embodiments, a semiconductor device and a method for manufacturing the semiconductor device can be provided in which the characteristics can be improved stably.

In the embodiments, it is favorable for the third nitride region 30 to be formed by atomic layer deposition (ALD). Thereby, for example, the third nitride region 30 can be formed uniformly even at the recess 18r.

The first insulating film 41 includes, for example, silicon and nitrogen. The second insulating film 42 includes, for example, silicon and oxygen. The second insulating film 42 does not include nitrogen. Or, the concentration of nitrogen included in the second insulating film 42 is lower than the concentration of nitrogen included in the first insulating film 41. For example, the second nitride region 20 is protected by the first insulating film 41. For example, stable characteristics are obtained when the second insulating film 42 functions as the gate insulating film.

Heat treatment of the first nitride region 10 exposed at the bottom portion 18b of the recess 18r may be performed before the formation of the third nitride region 30 (step S130). For example, the heat treatment is performed in an atmosphere including ammonia. Thereby, for example, the element that is included in the gas used when forming the recess 18r is removed. For example, the flatness of the surface of the bottom portion 18b (the first surface 10fa) improves.

According to the embodiments, a semiconductor device and a method for manufacturing the semiconductor device can be provided in which the characteristics can be improved stably.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as nitride regions, electrodes, insulating layers, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices, and methods for manufacturing the same practicable by an appropriate design modification by one skilled in the art based on the semiconductor devices, and the methods for manufacturing the same described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
   a first electrode;
   a second electrode;
   a first nitride region including $Al_{x1}Ga_{1-x1}N$ ($0 \leq x1 < 1$) and including a first partial region, a second partial region, a third partial region between the first partial region and the second partial region, a fourth partial region between the first partial region and the third partial region, and a fifth partial region between the third partial region and the second partial region, a first direction from the first partial region toward the first electrode crossing a second direction from the first electrode toward the second electrode, a direction from the second partial region toward the second electrode being aligned with the first direction;
   a second nitride region including $Al_{x2}Ga_{1-x2}N$ ($0 < x2 \leq 1$ and $x1 < x2$) and including a sixth partial region and a seventh partial region, a direction from the fourth partial region toward the sixth partial region being aligned with the first direction, a direction from the fifth partial region toward the seventh partial region being aligned with the first direction;
   a third electrode, a direction from the third partial region toward the third electrode being aligned with the first direction, at least a, portion of the third electrode being between the sixth partial region and the seventh partial region in the second direction;
   a first insulating film including silicon and nitrogen and including a first insulating region and a second insulating region;
   a third nitride region including $Al_{x3}Ga_{1-x3}N$ ($0 < x3 \leq 1$ and $x1 < x3$) and including first to seventh portions, the first portion being between the third electrode and the third partial region, the second portion being between the third electrode and the fourth partial region, the third portion being between the third electrode and the fifth partial region; the fourth portion being between the third electrode and the sixth partial region, the fifth portion being between the third electrode and the seventh partial region, the first insulating region being between the sixth portion and the sixth partial region, the second insulating region being between the seventh portion and the seventh partial region; and
   a second insulating film including silicon and oxygen and including third to seventh insulating regions, the third insulating region being between the first portion and the third electrode, the fourth insulating region being between the fourth portion and the third electrode, the fifth insulating region being between the fifth portion and the third electrode, the sixth portion being between the sixth insulating region and the first insulating region, the seventh portion being between the seventh insulating region and the second insulating region,
   wherein a crystallinity of the first portion is higher than a crystallinity of the sixth portion.

2. The device according to claim 1, wherein
at least a portion of the first portion includes a crystal, and
at least a portion of the sixth portion is amorphous.

3. The device according to claim 1, wherein a crystallinity of the second portion is higher than a crystallinity of the sixth portion.

4. The device according to claim 1, wherein a crystallinity of the fourth portion is higher than a crystallinity of the sixth portion.

5. The device according to claim 1, wherein
the second insulating film further includes an eighth insulating region and a ninth insulating region,
the eighth insulating region is between the fourth portion and the third electrode, and
the ninth insulating region is between the fifth portion and the third electrode.

6. The device according to claim 1, wherein
the second insulating film does not include nitrogen, or
a concentration of nitrogen included in the second insulating film is lower ti concentration of nitrogen included in the first insulating film.

7. The device according to claim 1, wherein
the third partial region includes a first surface opposing the first portion,
the sixth partial region includes a second surface opposing the first insulating region, and
a distance along the first direction between a position along the first direction of the first surface and a position along the first direction of the second surface is 60 n T1 or more.

8. The device according to claim 1, wherein
the third partial region includes a region including a first surface opposing the first portion, and
a concentration of boron in the region including the first surface is $1\times10^{18}$ atoms/cm$^3$ or less.

9. The device according to claim 1, wherein
the third partial region includes a region including a first surface opposing the first portion, and
a concentration of chlorine in the region including the first surface is $1\times10^{16}$ atoms/cm$^3$ or less.

10. The device according to claim 1, wherein
the third partial region includes a first surface opposing the first portion, and
a surface roughness of the first surface is 1 nm or less.

11. The device according to claim 1, wherein a distance along the second direction between the first insulating region and the second insulating region is 3 µm or less.

12. The device according to claim 1, wherein a distance along the second direction between the sixth partial region and the seventh partial region is 3 µm or less.

13. The device according to claim 1, wherein x3 is higher than x2.

14. The device according to claim 1, wherein
x1 is not less than 0 and not more than 0.05,
x2 is not less than 0.05 and not more than 0.3, and
x3 is greater than 0.3 and not more than 1.

15. The device according to claim 1, wherein
a potential of the third electrode referenced to a potential of the first electrode is positive when Id/Wg is $5\times10^{-4}$ A/mm,
a third direction is a direction crossing a plane including the first direction and the second direction,
Wg (meters) is a length along the third direction of a portion of one of the first electrode or the second electrode opposing the other of the first electrode or the second electrode, and
Id (amperes) is a current flowing between the first electrode and the second electrode.

16. A semiconductor device, comprising:
a first electrode;
a second electrode;
a first nitride region including $Al_{x1}Ga_{1-x1}N$ (0≤x1<1) and including a first partial region, a second partial region, a third partial region between the first partial region and the second partial region, a fourth partial region between the first partial region and the third partial region, and a fifth partial region between the third partial region and the second partial region, a first direction from the first partial region toward the first electrode crossing a second direction from the first electrode toward the second electrode, a direction from the second partial region toward the second electrode being aligned with the first direction;
a second nitride region including $Al_{x2}Ga_{1-x2}N$ (0<x2≤1 and x1<x2) and including a sixth partial region and a seventh partial region, a direction from the fourth partial region toward the sixth partial region being aligned with the first direction, a direction from the fifth partial region toward the seventh partial region being aligned with the first direction;
a third electrode, a direction from the third partial region toward the third electrode being aligned with the first direction, at least a portion of the third electrode being between the sixth partial region and the seventh partial region in the second direction;
a first insulating film including silicon and nitrogen and including a first insulating region and a second insulating region;
a third nitride region including $Al_{x3}Ga_{1-x3}N$ (0<x3≤1 and x1<x3) and including first to seventh portions, the first portion being between the third electrode and the third partial region, the second portion being between the third electrode and the fourth partial region, the third portion being between the third electrode and the fifth partial region, the fourth portion being between the third electrode and the sixth partial region, the fifth portion being between the third electrode and the seventh partial region, the first insulating region being between the sixth portion and the sixth partial region, the second insulating region being between the seventh portion and the seventh partial region; and
a second insulating film including silicon and oxygen and including third to seventh insulating regions, the third insulating region being between the first portion and the third electrode, the fourth insulating region being between the fourth portion and the third electrode, the fifth insulating region being between the fifth portion and the third electrode, the sixth portion being between the sixth insulating region and the first insulating region, the seventh portion being between the seventh insulating region and the second insulating region,
wherein
the third partial region includes a region including a first surface opposing the first portion, and
a concentration of boron in the region including the first surface is $1\times10^{18}$ atoms/cm$^3$ or less.

17. The device according to claim 16, wherein
the third partial region includes a first surface opposing the first portion,
the sixth partial region includes a second surface opposing the first insulating region, and a distance along the first direction between a position along the first direction of the first surface and a position along the first direction of the second surface is 60 nm or more.

18. The device according to claim 16, wherein a distance along the second direction between the first insulating region and the second insulating region is 3 μm or less.

19. A semiconductor device, comprising:
a first electrode;
a second electrode;
a first nitride region including $Al_{x1}Ga_{1-x1}N$ ($0 \le x1 < 1$) and including a first partial region, a second partial region, a third partial region between the first partial region and the second partial region, a fourth partial region between the first partial region and the third partial region, and a fifth partial region between the third partial region and the second partial region, a first direction from the first partial region toward the first electrode crossing a second direction from the first electrode toward the second electrode, a direction from the second partial region toward the second electrode being aligned with the first direction;
a second nitride region including $Al_{x2}Ga_{1-x2}N$ ($0 < x2 \le 1$ and $x1 < x2$) and including a sixth partial region and a seventh partial region, a direction from the fourth partial region toward the sixth partial region being aligned with the first direction, a direction from the fifth partial region toward the seventh partial region being aligned with the first direction;
a third electrode, a direction from the third partial region toward the third electrode being aligned with the first direction, at least a portion of the third electrode being between the sixth partial region and the seventh partial region in the second direction;
a first insulating film including silicon and nitrogen and including a first insulating region and a second insulating region;
a third nitride region including $Al_{x3}Ga_{1-x3}N$ ($0 < x3 \le 1$ and $x1 < x3$) and including first to seventh portions, the first portion being between the third electrode and the third partial region, the second portion being between the third electrode and the fourth partial region, the third portion being between the third electrode and the fifth partial region, the fourth portion being between the third electrode and the sixth partial region, the fifth portion being between the third electrode and the seventh partial region, the first insulating region being between the sixth portion and the sixth partial region, the second insulating region being between the seventh portion and the seventh partial region; and
a second insulating film including silicon and oxygen and including third to seventh insulating regions, the third insulating region being between the first portion and the third electrode, the fourth insulating region being between the fourth portion and the third electrode, the fifth insulating region being between the fifth portion and the third electrode, the sixth portion being between the sixth insulating region and the first insulating region, the seventh portion being between the seventh insulating region and the second insulating region,
wherein
the third partial region includes a region including a first surface opposing the first portion, and
a concentration of chlorine in the region including the first surface is $1 \times 10^{16}$ atoms/cm$^3$ or less.

20. The device according to claim 19, wherein
the third partial region includes a first surface opposing the first portion,
the sixth partial region includes a second surface opposing the first insulating region, and
a distance along the first direction between a position along the first direction of the first surface and a position along the first direction of the second surface is 60 nm or more.

* * * * *